United States Patent
Nanbu et al.

[11] Patent Number: 6,052,400
[45] Date of Patent: Apr. 18, 2000

[54] VARIABLE WAVELENGTH SEMICONDUCTOR LASER

[75] Inventors: Yoshihiro Nanbu; Kenichi Nishi, both of Tokyo, Japan

[73] Assignee: NEC Corporation, Japan

[21] Appl. No.: 09/052,654

[22] Filed: Mar. 31, 1998

[30] Foreign Application Priority Data

Apr. 17, 1997 [JP] Japan ................................. 9-100332

[51] Int. Cl.[7] ...................................................... H01S 3/19
[52] U.S. Cl. .............................. 372/50; 372/11; 372/18; 372/20; 372/43; 372/46
[58] Field of Search .............................. 372/11, 18, 20, 372/43, 50, 46

[56] References Cited

U.S. PATENT DOCUMENTS 5,799,024  8/1998  Bowers et al. ............................ 372/11

FOREIGN PATENT DOCUMENTS

| 63-32985 | 2/1988 | Japan | H01S 3/18 |
|---|---|---|---|
| 63-213384 | 9/1988 | Japan | H01S 3/18 |
| 63-232479 | 9/1988 | Japan | H01S 3/18 |
| 2110987 | 4/1990 | Japan | H01S 3/18 |
| 555701 | 3/1993 | Japan | H01S 3/18 |
| 5218577 | 8/1993 | Japan | H01S 3/18 |
| 6196819 | 7/1994 | Japan | H01S 3/18 |
| 7221403 | 8/1995 | Japan | H01S 3/18 |
| 818167 | 1/1996 | Japan | H01S 3/18 |
| 8172217 | 7/1996 | Japan | H01L 33/00 |
| 8236869 | 9/1996 | Japan | H01S 3/18 |
| 10112567 | 4/1998 | Japan | H01S 3/18 |

OTHER PUBLICATIONS

"Semicondcuotr Laser Transmitters for WDM" Verdiell et al SPIE, vol. 2690; pp. 286–295 No date.
"Room Temperature lasing ffrom InGaAs quantum dots" Mirin et al Electronics Letters; Aug. 29, 1996; vol. 32, No. 18; pp. 1732–1734.
"Room temperature CW operation at the ground state of self–formed quantum dot lasers with multi–stacked dot layer" Shoji et al Electronics Letters; Oct. 10, 1996; vol. 32, No. 21; pp. 2023–2024.
"Control of Lasign spectra for semiconductor lasers—Spectral linewidth narrowing and wavelength tuning" Okai Applied Physics; vol. 63; 1994; pp. 4–15 No month.

*Primary Examiner*—Hemang Sanghavi
*Assistant Examiner*—Benjamin Cushwa
*Attorney, Agent, or Firm*—Hayes, Soloway, Hennessey, Grossman & Hage, P.C.

[57] ABSTRACT

The object of the present invention is to provide a variable wavelength semiconductor laser which is large in ontinuous variable wavelength width, simple and convenient in structure, easy to produce, monolithic and small in size, and easy to handle. The variable wavelength semiconductor laser includes an optical gain region formed from two-dimensional or three-dimensional carrier confinement structures having sizes approximately of a thermal de Broglie wavelength whose size dispersion is controlled so that a gain spectrum covers a required variable wavelength region for generating and amplifying light when current is injected, a light absorption control region having a light absorption coefficient which varies depending upon a current injection amount, an optical resonator including the optical gain region and the light absorption control region, and control means for controlling current amounts or voltage values to be injected to the optical gain region and the light absorption control region.

3 Claims, 3 Drawing Sheets

VARIABLE WAVELENGTH SEMICONDUCTOR LASER

BACKGROUND OF THE INVENTION

1. Field of the Invention

This invention relates to a variable wavelength semiconductor laser having a variably controllable oscillation frequency which can be utilized in the fields of optical information processing, optical communication and so forth.

2. Description of the Related Art

Since a variable wavelength semiconductor laser can generate laser light of a required wavelength readily, it is expected to be applied, as an optical frequency band utilizing optical device for wavelength multiplex communication or signal processing, to optical communication and optical information processing systems. Further, the variable wavelength semiconductor laser is useful also for optical measuring systems including scientific measurement.

Conventionally, as systems which realize a variable wavelength semiconductor laser, principally the two systems of 1. variable wavelength distribution Bragg reflecting mirror semiconductor lasers, and
2. external resonator type semiconductor lasers, as that disclosed in J. Verdiell et al., SPIE, Vol. 2,690, pp. 286–295 and that disclosed in Okai, Applied Physics, Vol. 63, pp. 2–13 have been investigated.

FIG. 1 is a view showing a structure in principle of a representative variable wavelength distribution Bragg reflecting mirror semiconductor laser. The variable wavelength distribution Bragg reflecting mirror semiconductor laser is constructed such that it is electrically separated into the two regions of gain region 31 and passive distribution Bragg reflecting mirror region 32 in a laser resonator and current can be injected to the regions independently of each other. To gain region 31, current is injected through laser electrode 34, but to passive distribution Bragg reflecting mirror region 32, current is injected to wavelength control electrode 35.

Passive distribution Bragg reflecting mirror region 32 has a characteristic that the optical refractive index thereof with respect to the laser oscillation wavelength is varied by a plasma effect when current is injected thereto. An end face of passive distribution Bragg reflecting mirror region 32 on the gain region side is formed as an interface at which it contacts with air by cleavage and acts as a reflecting mirror having a reflection factor of approximately 30%. Meanwhile, on another end face of passive distribution Bragg reflecting mirror region 32 on the distribution Bragg reflecting mirror region side, nonreflective coating 33 of a dielectric multiple layer film is provided.

Since the effective resonator length of the laser resonator varies by a variation of the refractive index of passive distribution Bragg reflecting mirror region 32 and the Bragg wavelength varies simultaneously, the reflection characteristic of the distribution Bragg reflecting mirror varies. By effects of the variations of both of them, the wavelength of laser oscillation light 36 varies. It is known that, accordingly, the present laser can vary the wavelength of laser oscillation light 36 by adjusting the current injection amount to the distribution Bragg reflecting mirror region.

Meanwhile, FIG. 2 is a view showing a structure in principle of an external resonator type semiconductor laser. In the external resonator type semiconductor laser shown in FIG. 2, one end face of semiconductor laser 41 is formed as high reflection coating 47 while the other end face of semiconductor laser 41 is formed as nonreflective coating 46, and light generated in active region 45 of semiconductor laser 41 and emitted from the end face of semiconductor laser 41 on nonreflective coating 46 side is coupled to diffraction grating 44 by collimate lens 42 so that a laser resonator is formed from the high reflection coating 47 and diffraction grating 44.

Since diffraction grating 44 has a wavelength selective reflection characteristic in accordance with the incidence angle as well known in the art, the laser oscillation wavelength can be varied by rotating diffraction grating 44.

However, such variable wavelength semiconductor lasers as described above have the following problems.

The variable wavelength distribution Bragg reflecting mirror semiconductor laser shown in FIG. 1 has a problem in that, from a reason in principle that the variable wavelength band is narrow and effects of both of a variation of the effective resonator length of the laser resonator and a variation of the reflection characteristic of the distribution Bragg reflecting mirror by a variation of the refractive index of distribution Bragg reflecting mirror region 32 participate in the variation of the oscillation wavelength of the laser, a jump between longitudinal modes occurs upon wavelength variation and consequently the wavelength band which allows continuous variation is small.

In order to solve the problem just described, also a three-electrode type variable wavelength distribution Bragg reflecting mirror semiconductor laser has been attempted wherein a phase adjustment region is provided between the gain region and the distribution Bragg reflecting mirror region and current is supplied to the phase adjustment region to cancel the variation of the refractive index of distribution Bragg reflecting mirror region 32. Also in this instance, however, the continuously variable wavelength width remains within the order of several nm. Besides, since the structure is complicated, there is a problem in that it is difficult to produce the laser.

The external resonator type semiconductor laser shown in FIG. 2 has a problem in that, although the continuously variable wavelength width is large, since it is not a monolithic device, it is difficult to utilize in terms of the size and handling.

SUMMARY OF THE INVENTION

The present invention has been made in view of the various problems of the prior art described above, and it is an object of the present invention to provide a variable wavelength semiconductor laser which is large in continuously variable wavelength width, simple in structure, easy to manufacture, monolithic and small in size, and easy to handle.

In order to attain the object described above, according to an aspect of the present invention, there is provided a variable wavelength semiconductor laser, comprising an optical gain region formed from two-dimensional or three-dimensional carrier confinement structures having sizes approximately of a thermal de Broglie wavelength whose size dispersion is controlled so that a gain spectrum covers a required variable wavelength region for generating and amplifying light when current is injected, a light absorption control region having a light absorption coefficient which varies depending upon a current injection amount, an optical resonator including the optical gain region and the light absorption control region, and control means for controlling current amounts to be injected or voltage values to be applied to the optical gain region and the light absorption control region.

According to another aspect of the present invention, there is provided a variable wavelength semiconductor laser, comprising an optical gain region formed from two-dimensional or three-dimensional carrier confinement structures having sizes approximately of a thermal de Broglie wavelength whose size dispersion is controlled so that a gain spectrum covers a required variable wavelength region for generating and amplifying light when current is injected, a light absorption control region having a light absorption coefficient which varies depending upon a current injection amount, an optical resonator including the optical gain region and the light absorption control region, and oscillation wavelength control means for controlling current amounts or voltage values to be injected to the optical gain region and the light absorption control region in response to a signal inputted thereto and indicative of an oscillation wavelength.

In this instance, the oscillation wavelength control means may include first control means for determining a current amount or a voltage value to the optical gain region, second control means for determining a current amount or a voltage value to the light absorption control region, a table in which oscillation wavelengths and current injection amounts or application voltage values to the light absorption control region and the gain region which are different depending upon the oscillation wavelengths are stored, and a control input terminal, and the variable wavelength semiconductor laser may further comprise a programmable controller for reading out, in response to an oscillation wavelength indicated by a signal inputted to the control input terminal, those current injection amounts or application voltage values to the light absorption control region and the gain region stored in the table and controlling the current amounts or the voltage values to the optical gain region and the light absorption control region through the first control means and the second control means, respectively, based on the read out current injection amounts or application voltage values.

Basic operation of the present invention is described below.

In recent years, investigations for application of low-dimensional carrier confinement structures of a very small size called quantum fine line or quantum dot to electronic devices or optical devices have been and are being proceeded energetically. Those low-dimensional carrier confinement structures are characterized in that the confinement size is approximately equal to a thermal de Broglie wavelength $$\lambda_T (\lambda_T = h / \sqrt{2\pi m k_B T}; \quad m: \text{effective mass of a carrier})$$

nr.effective mass of a carrier) of a carrier system, and therefore, it is expected that an effect called quantum effect be manifested.

To optical devices, the merit of the low-dimensional carrier confinement structures of a quantum mechanical size (such structure is hereinafter referred to as quantum confinement structure) is that the state density is steep. This signifies that, physically speaking, dipoles (electron-hole pairs) which can exist in a medium can be concentrated in a certain discrete transition energy state. The reason why this is possible is that, where carriers are confined spatially, the non-individuality of carriers of same particle is lost and, as a result, the Pauli's exclusion principle is related (if the Pauli's exclusion principle is not effective, then since no exchange interaction occurs, degeneracy of an energy level is not solved).

The present invention first makes use of a characteristic of the quantum confinement structure that the confinement size can be designed/controlled artificially and freely. In the quantum confinement structure, the transition energy can be controlled by controlling the size of each quantum structure, and accordingly, the shape of the state density spectrum when of the entire system can be controlled freely. If this fact is utilized, then the gain spectrum of the quantum confinement system can be designed freely.

Now, consider the number of quantum dot structures having a size R is represented by N(R) and the transition energy is represented by E(R), then the state density of the system corresponding to this is given by $$\frac{dN}{dE} = \frac{dN}{dR} \bigg/ \frac{dE}{dR}$$

N(R) (size distribution) is a controllable amount, and an arbitrary state density spectrum can be produced by controlling N(R). Where the distance between adjacent quantum structures is sufficiently large, excitation transfer between quantum structures can be ignored, and since carriers are expected to be injected uniformly in an equal probability into the quantum structures, a gain spectrum which increases in direct proportion to the shape of a state density spectrum is obtained.

In the present invention, as a first factor, a gain medium having a broad gain spectrum is produced by a collection of quantum confinement structure whose size distribution is controlled by making use of the principle described above, and the gain medium produced is utilized as a gain medium for a variable wavelength semiconductor laser. To this end, a dispersion in size of quantum structures should be made large. Although actually the emission spectrum of semiconductor quantum dot structures produced by the technique in the present situation is not so narrowed as is expected by narrowing of a state density spectrum, it is interpreted that this is caused by a dispersion in size of the quantum dot system. Accordingly, from a quantum structure system which has a large size dispersion, a sufficiently broad emission spectrum and a sufficiently broad gain spectrum are obtained.

Next, a second factor of the present invention is described pointing out a fact obtained by an experiment. A laser oscillates when the sum of a coupling loss of an optical resonator and other optical losses is balanced with an optical gain of a gain medium. To this end, a state density higher than a certain value which depends upon a loss is required for the gain medium. This is because the optical gain when the population of dipoles which are present in the state density is reversed completely must be at least higher than the optical loss. When this requirement is not satisfied, in whatever manner the gain medium is excited, no laser oscillation occurs.

On the other hand, while the energy levels in semiconductor quantum structures are discrete due to quantization, generally a level on the higher energy side (such a level is called higher-order level) has a higher degeneracy and accordingly provides a higher state density. If carriers are injected into a gain medium formed from such semiconductor quantum structures, then the carriers move between the energy levels in the quantum structures and exhibit a Fermi-Dirac distribution in a thermal equilibrium state. As a result, as the injection amount of carriers is increased, the states are successively occupied beginning from a state of the low energy side of the state density (state filling).

In a laser wherein semiconductor quantum structures are used as a gain medium, as the optical loss increases, the injection carrier density necessary for laser oscillation increases. In this instance, if the density in number of quantum structures in the active region is a certain low value, the gain cannot exceed the loss even if the states of the low energy side are occupied completely. Consequently, oscillation occurs on the high energy side having a higher state density. As a result, it is sometimes observed that oscillation wavelength becomes shorter as the optical loss increases in the layer where a gain medium is made of semiconductor quantum structure and the number density of quantum structures has a somewhat low value. This is confirmed actually by R. Mirin et al., Electronics Letter, Vol. 32, pp. 1,732–1,734 and H. Shoji et al., Electronics Letter, Vol. 32, pp. 2,023–2,024. In those reports, it is observed that, under such a condition that the coupling loss of an optical resonator is dominant in determination of a laser threshold value (the reflection of a resonator mirror is low), as the resonator length decreases (the optical loss increases in inverse proportion to the resonator length), the laser oscillation length becomes shorter and the width of the wavelength variation reaches approximately 50 nm.

The present invention makes use of the first and second factors described above. In the present invention, a medium composed of fine structures which have a quantum confinement effect such as semiconductor quantum dots or quantum wire structures is adopted as a gain medium. In this instance, a sufficiently broad gain wavelength width is secured by making the size dispersion of the quantum structures large. In a semiconductor quantum structure producing technique at present technology, if special size control is not performed for production, then quantum structures having a large size dispersion are produced naturally. Therefore, it is easy to produce semiconductor quantum structures having a large size dispersion.

Then, in the present invention, an absorption region whose absorption coefficient can be controlled from the outside is provided in the laser resonator in addition to the gain region. For this controllable absorption region, for example, a region which has a medium and electrode structure quite same as that of the gain region and has no gain by reading injection current. In this instance, the absorption coefficient can be controlled in accordance with the injection current amount to the absorption region by making use of state filling effect. If the current injection to the absorption region and the current injection to the gain region are made controllable independently of each other and the injection current to the gain region is increased so that an increase of the absorption coefficient by reduction of the current injection amount to the absorption region may be compensated for, then the laser oscillation wavelength can be controlled by controlling the absorption coefficient of the absorption region in accordance with the principle described above.

Further, if the current injection amount to the gain region necessary to compensate for the increase of the absorption coefficient by reduction of the current injection amount to the absorption region is measured in advance and a relationship between them is recorded and then the current injection amount to the absorption region and the current injection amount to the gain region are controlled simultaneously based on a parameter given from the outside in accordance with the record, then a simple and convenient variable wavelength semiconductor laser whose laser oscillation wavelength can be controlled using a single parameter given from the outside can be realized.

The above and other objects, features and advantages of the present invention will become apparent from the following description with reference to the accompanying drawings which illustrate examples of the present invention.

DETAILED DESCRIPTION OF THE PREFERRED EMBODIMENTS

In the following, embodiments of the present invention are described with reference to the drawings.

Figure 1:
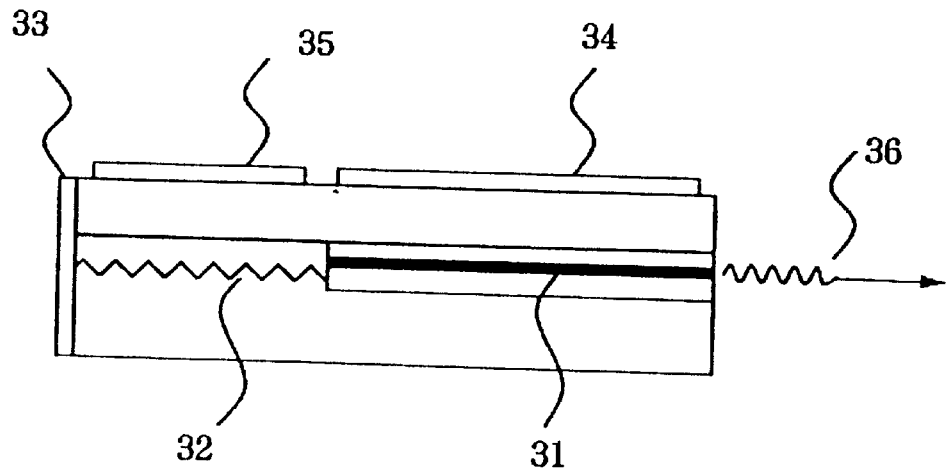
FIG. 1 is a view showing a two-electrode type variable wavelength distribution Bragg reflecting mirror laser which is a prior art of a variable wavelength semiconductor laser.
Figure 2:
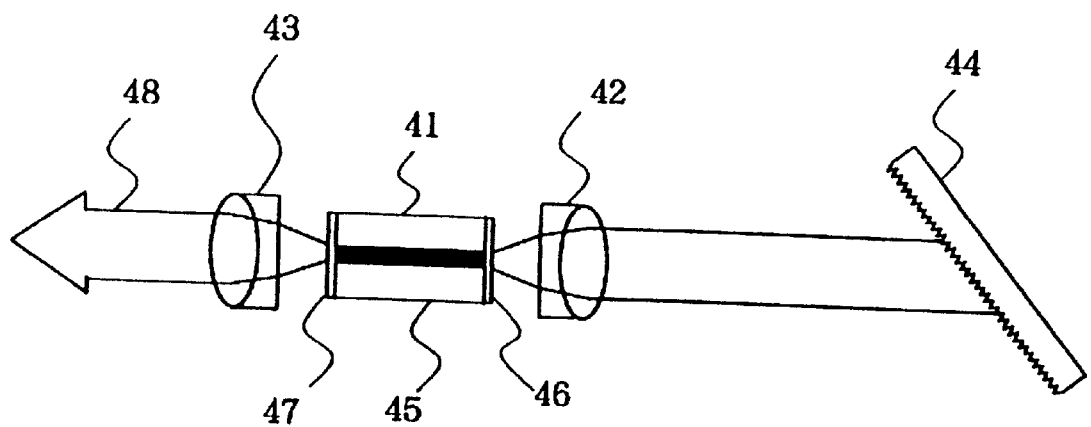
FIG. 2 is a view showing an external resonator type variable wavelength laser which is another prior art of a variable wavelength semiconductor laser.
Figure 3:
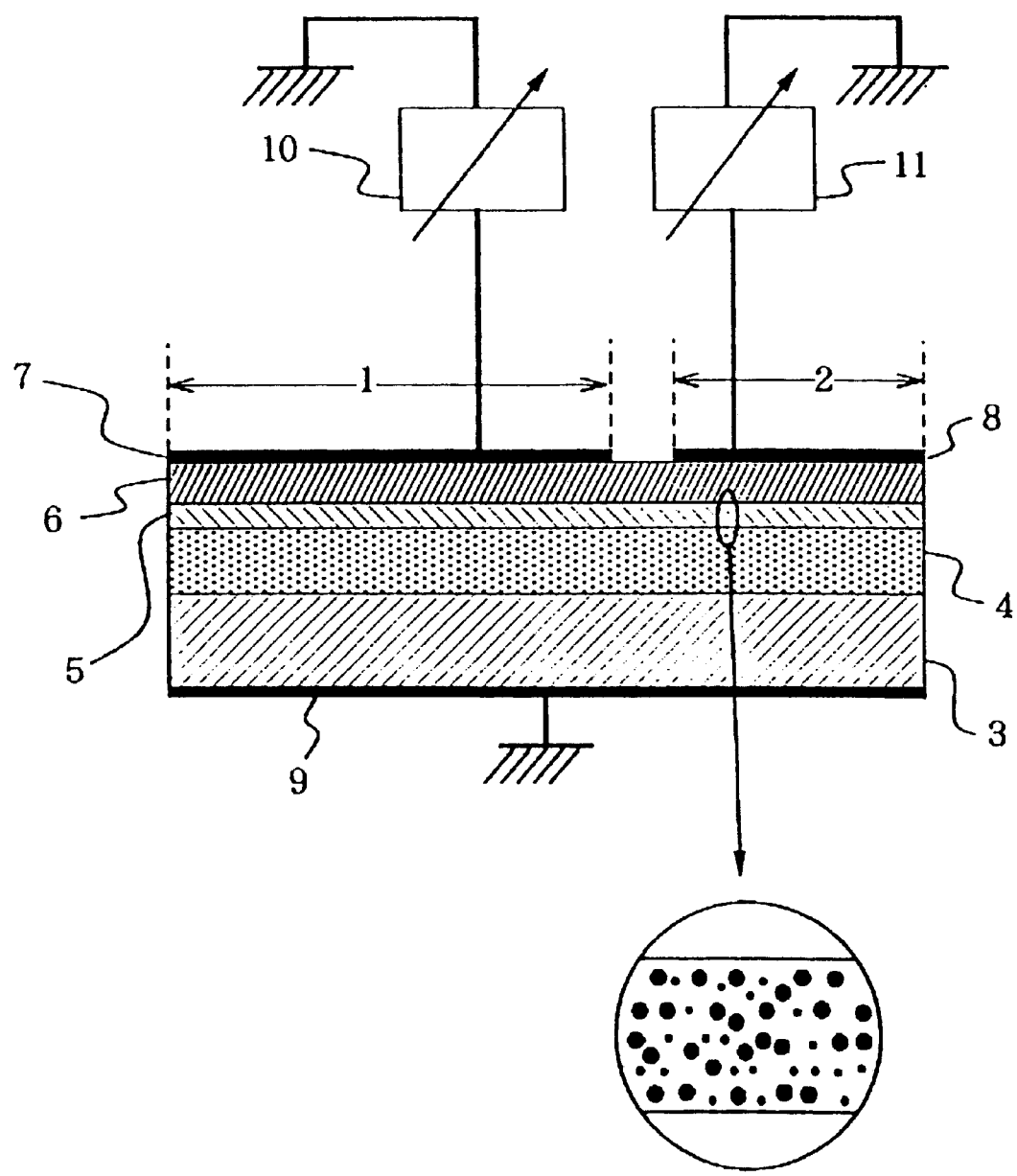
FIG. 3 is a sectional view of a variable wavelength semiconductor laser showing a first embodiment of the present invention.

FIG. 3 is a view showing a construction of a variable wavelength InGaAsP semiconductor laser as a first embodiment according to the present invention and is a sectional view taken in a direction perpendicular to a crystal plane.

The present embodiment is an example which employs quantum dots as quantum structures. The variable wavelength semiconductor laser of the present embodiment is an edge emitting type laser which emits light in a direction parallel to a grown layer of a semiconductor and has a structure wherein one of a p-type electrode and an n-type electrode which is positioned on the epitaxial growth plane side is divided into two or more portions which are electrically isolated from each other with a waveguide region of a low loss interposed therebetween.

The present embodiment is a variable wavelength semiconductor laser of a simplest type having two electrodes. Referring to FIG. 3, gain region 1 is a region in which light is generated and amplified, and light absorption control region 2 is a region which absorbs the light generated by gain region 1. The structure of the present embodiment is obtained in the following manner. Using a thin film growing apparatus such as an MOVPE, n-inP clad layer 4 is first grown on n-InP substrate 3, and InGaAsP quantum dot structures are produced by a Stranski-Krastanow growth method (a quantum dot structure growing method which makes use of the fact that, upon growth of a semiconductor strain layer, the growth mode changes from two-dimensional growth to three-dimensional growth) or a like method and are buried with i-InP. The sequence of steps just described is repeated to produce active layer 5 which includes a large number of InGaAsP quantum dot layers. Thereafter, p-InP clad layer 6 is grown. Then, p-type laser current injection electrode 7 for injecting current to gain region 1 and p-type absorption control electrode 8 for injecting current to light absorption control region 2 are formed, and then the substrate is polished, whereafter n-type electrode 9 is formed on the rear face of the substrate. Both end faces of the device function as reflecting mirrors having a reflection factor of approximately 30% as a result of cleavage an nstruct an optical resontor.

In the variable wavelength InGaAsP semiconductor laser of the present embodiment, active layer 5 formed in light absorption control region 2 has a light absorption coefficient which varies depending upon the amount of current injected thereto from absorption controlling power supply 11, and the oscillation wavelength of the variable wavelength InGaAsP semiconductor laser is varied by current injected from laser current injecting power supply 10 through p-type laser current injection electrode 7 and current injected from absorption controlling power supply 11.

In the present embodiment, upon production of active layer 5, such control as to adjust the sizes of quantum dots was not performed, but growth was performed under such a condition that a size dispersion might be rather increased as seen from the enlarged sectional view of active layer 5 shown in FIG. 3. When a quantum dot structure is approximated to a sphere of radius R, the lowest-order transition energy is approximately given by $$E = E_g + \frac{\hbar^2 \pi^2}{2R^2}\left(\frac{1}{m_e} + \frac{1}{m_h}\right)$$

where Eg is the band gap energy, and $m_e$ and $m_h$ are effective masses of an electron and a hole, respectively. Accordingly, an active layer having a large gain wavelength width can be produced by producing a large number of quantum dots which have a large size dispersion.

When current of 60 mA was injected to light absorption control region 2 of the laser constructed in such a manner as described above and current of 100 mA was injected to gain region 1, the laser oscillated with a wavelength of 960 nm. When the current injection amount to light absorption control region 2 was decreased to 50 mA, the laser oscillation stopped once, but when the current injection amount to gain region 1 was increased to 110 mA, the laser oscillated again and the oscillation wavelength then became shorter to 950 nm. Thereafter, as the current injection amount to the light absorption control region was successively reduced and the current injection amount to the gain region was increased simultaneously so as to keep the laser oscillation, the laser oscillation wavelength continuously shifted toward the shorter wavelength direction, and it was confirmed that the oscillation wavelength can be varied continuously in the width of 110 nm from 960 to 850 nm.

It is to be noted that each of laser current injecting power supply 10 and absorption controlling power supply 11 in the present embodiment does not solely supply injection current (or voltage) but cooperates with a power supply (not shown) provided outside to effect such injection and operates as control means for controlling the current injection amount (or application voltage value). More particularly, each of laser current injecting power supply 10 and absorption controlling power supply 11 is composed of a voltage-controllable variable resistor, and the current injection amounts (or application voltage values) of laser current injecting power supply 10 and absorption controlling power supply 11 are determined by control voltages inputted to control terminals not shown provided for the variable resistors.

Next, a second embodiment of the present invention is described with reference to FIG. 4.

The second embodiment of the present invention corresponds to the first embodiment shown in FIG. 3 to which a control system is added. If the current injection amount to light absorption control region 2 and the current injection amount to gain region 1 are measured in advance and the measured data are programmed in a programmable control apparatus such as a microcomputer, then the oscillation frequency can be controlled simply and conveniently by entering an oscillation frequency as a single control parameter from the outside.

Figure 4:
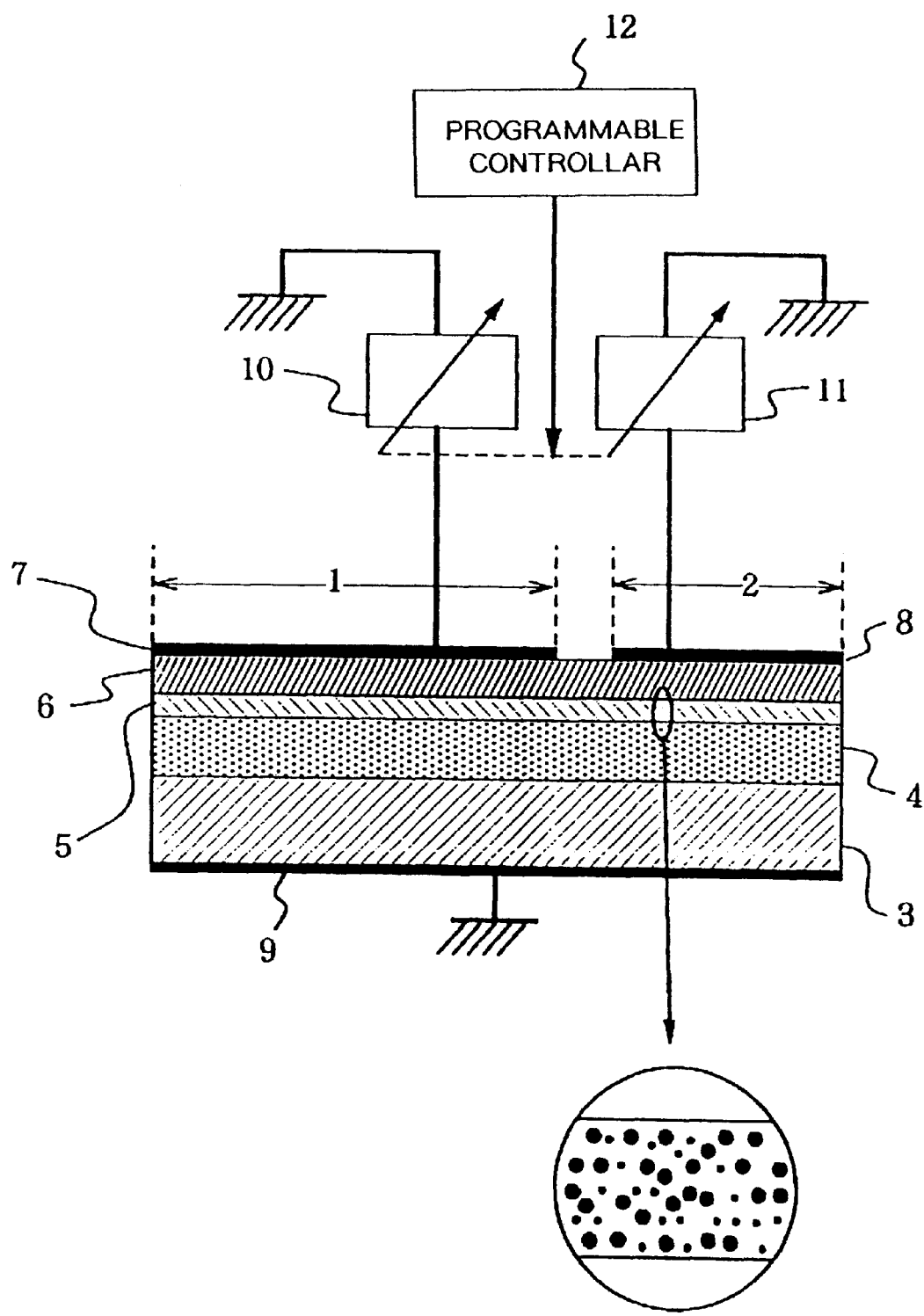
FIG. 4 is a sectional view of another variable wavelength semiconductor laser showing a second embodiment of the present invention.

The present embodiment is based on the concept just described and is constructed such that, as shown in FIG. 4, laser current injecting power supply 10 and absorption controlling power supply 11 are cooperatively controlled by programmable controller 12 (oscillation wavelength control means) in which the measured values are programmed. Programmable controller 12 includes a table in which control values to laser current injecting power supply 10 and absorption controlling power supply 11 for realizing an oscillation frequency and a current injection amount (or application voltage value) to light absorption control region 2 and a current injection amount (or application voltage value) to gain region 1 which are different depending upon the oscillation frequency are stored, and a control input terminal (not shown). In response to an oscillation frequency indicated by a signal inputted to the control input terminal, corresponding control values to laser current injecting power supply 10 and absorption controlling power supply 11 stored in the built-in table are read out to control laser current injecting power supply 10 and absorption controlling power supply 11 therewith, respectively. Consequently, only by inputting a signal indicative of an oscillation frequency to the control input terminal, the current injection amount to light absorption control region 2 and the current injection amount to gain region 1 are determined to obtain the inputted oscillation frequency.

By the construction of the present embodiment, a required oscillation wavelength can be obtained with a high degree of repeatability by a simple operation.

Where the variable wavelength semiconductor lasers according to the embodiments described above are used, a variable wavelength semiconductor laser which is large in continuous variable wavelength width, simple and convenient in structure, easy to produce, monolithic and small in size, and easy and convenient to handle can be realized. It was found from variable wavelength semiconductor light emitting lasers produced in accordance with the present embodiments that a semiconductor laser having a variable wavelength width similar to that of a conventional external resonator variable wavelength laser can be obtained in a monolithic form of a reduced size without any difficult production technique.

While the foregoing embodiments are described taking certain semiconductor materials as an example, the method of the present invention is not limited to the embodiments described above. While, in the present embodiments, a laser wherein InGaAsP is used for quantum confinement structures and InP is used for a barrier layer is described as an example, the present invention can be applied also to variable wavelength semiconductor lasers for which other semiconductor materials such as GaAs, InP, InGaAs and InGaAsP are used.

Further, while, in the present embodiments, an example of a variable wavelength semiconductor laser of the two-electrode edge emitting type is described, the present invention can naturally be applied to a semiconductor laser of any other structure such as a surface emitting type laser or a multiple electrode laser. While the present embodiments are described that quantum dot structures are used, quantum wire structures may be used instead.

As described above, where a variable wavelength semiconductor laser according to the present invention is used, a variable wavelength semiconductor laser which is large in continuous variable wavelength width, simple and convenient in structure, easy to produce, monolithic and small in size, and easy and convenient to handle can be realized.

While preferred embodiments of the present invention have been described using specific terms, such description is for illustrative purpose only, and it is to be understood that changes and variations may be made without departing from the spirit or scope of the following claims.

What is claimed is:

1. A variable wavelength semiconductor laser, comprising:
   an optical gain region formed from two-dimensional or three-dimensional carrier confinement structures having sizes approximately of a thermal de Broglie wavelength whose size dispersion is controlled so that a gain spectrum covers a required variable wavelength region for generating and amplifying light when current is injected;
   a light absorption control region having a light absorption coefficient which varies depending upon a current injection amount;
   an optical resonator including said optical gain region and said light absorption control region; and
   control means for controlling current amounts or voltage values to be injected to said optical gain region and said light absorption control region.

2. A variable wavelength semiconductor laser, comprising:
   an optical gain region formed from two-dimensional or three-dimensional carrier confinement structures having sizes approximately of a thermal de Broglie wavelength whose size dispersion is controlled so that a gain spectrum covers a required variable wavelength region for generating and amplifying light when current is injected;
   a light absorption control region having a light absorption coefficient which varies depending upon a current injection amount;
   an optical resonator including said optical gain region and said light absorption control region; and
   oscillation wavelength control means for controlling current amounts or voltage values to be injected to said optical gain region and said light absorption control region in response to a signal inputted thereto and indicative of an oscillation wavelength.

3. A variable wavelength semiconductor laser as claimed in claim 2, wherein
   said oscillation wavelength control means includes:
      first control means for determining a current amount or a voltage value to said optical gain region;
      second control means for determining a current amount or a voltage value to said light absorption control region;
      a table in which oscillation wavelengths and current injection amounts or application voltage values to said light absorption control region and said gain region which are different depending upon the oscillation wavelengths are stored; and
      a control input terminal;
   said variable wavelength semiconductor laser further comprising a programmable controller for reading out, in response to an oscillation wavelength indicated by a signal inputted to said control input terminal, those current injection amounts or application voltage values to said light absorption control region and said gain region stored in said table and controlling the current amounts or the voltage values to said optical gain region and said light absorption control region through said first control means and said control means, respectively, based on the read out current injection amounts or application voltage values.

* * * * *